United States Patent [19]

Guo

[11] Patent Number: 5,403,459
[45] Date of Patent: Apr. 4, 1995

[54] CLEANING OF A PVD CHAMBER CONTAINING A COLLIMATOR

[75] Inventor: Xin Sheng Guo, Mountain View, Calif.

[73] Assignee: Applied Materials, Inc., Santa Clara, Calif.

[21] Appl. No.: 63,478

[22] Filed: May 17, 1993

[51] Int. Cl.6 ............................................. C23C 14/34
[52] U.S. Cl. ........................ 204/192.32; 204/298.11; 204/298.31; 156/643; 156/646
[58] Field of Search ............. 204/192.1, 192.12, 192.3, 204/192.32, 298.11, 298.31; 156/643, 646, 345

[56] References Cited

U.S. PATENT DOCUMENTS

| | | | |
|---|---|---|---|
| 4,717,462 | 1/1988 | Homma et al. | 204/298.11 |
| 4,786,361 | 11/1988 | Sekine et al. | 204/192.32 X |
| 5,171,412 | 12/1992 | Talieh et al. | 204/192.15 |
| 5,202,008 | 4/1993 | Talieh et al. | 204/192.32 |
| 5,223,108 | 6/1993 | Hurwitt | 204/298.11 |

FOREIGN PATENT DOCUMENTS

| | | | |
|---|---|---|---|
| 0440377A2 | 8/1991 | European Pat. Off. | |
| 0248876 | 12/1985 | Japan | 204/298.11 |

OTHER PUBLICATIONS

EP Search Report for EP appln 94106325.7, Aug. 23, 1994.

Primary Examiner—Nam Nguyen
Attorney, Agent, or Firm—Birgit E. Morris

[57] ABSTRACT

When a collimator is employed between the target and a substrate support in a physical vapor deposition chamber, since the collimator is grounded to the chamber walls, the chamber becomes divided electrically, because the collimator acts as a barrier to the passage of the plasma. Thus a two step plasma cleaning process must be performed to remove native oxide and sputtered deposits on parts of the chamber, particularly when parts of the chamber are replaced or removed. The first plasma clean step is conventional and cleans the upper portion of the chamber including the upper surface of the collimator. A positive bias source is then connected to the substrate support and a second cleaning plasma generated between the collimator and the support which cleans the parts of the chamber below the collimator, including the bottom surface of the collimator.

4 Claims, 3 Drawing Sheets

CLEANING OF A PVD CHAMBER CONTAINING A COLLIMATOR

This invention relates to cleaning shields and other parts of a physical vapor deposition chamber to remove films deposited thereon. More particularly this invention relates to cleaning a physical vapor deposition chamber containing a collimator in a two step process.

BACKGROUND OF THE INVENTION

A physical vapor deposition apparatus comprises a vacuum chamber having a target of a preselected material mounted thereon which is connected to a DC power supply; and a substrate which is mounted on a substrate support opposed to the target, which is connected to an RF power supply. During processing, the target material is bombarded with an inert gas, such as argon. Material from the target is dislodged or sputtered off and deposits onto the substrate, which can be for example a silicon wafer, a magnetic disk or a flat panel display. However, the sputtered material does not deposit in a line-of-sight direction only, and the sputtered material deposits on other parts of the chamber, such as the shield or clamping ring for the substrate.

In order to increase the directionality of the sputtered material onto the substrate, the use of a collimator has been suggested.

However, even when a collimator is used, the sputtered material deposits not only on the substrate, but also on surrounding parts of the chamber, such as clamping rings that hold the substrate onto the support during processing. Shields surrounding the substrate have been used to try to prevent sputtered material from depositing on the walls and other parts of the chamber. However, the shields become coated with the sputtered material and, due to build up of material that may have a coefficient of expansion different from that of the shield material itself, eventually results in flaking of the deposited material; this has the result that the deposited material forms particles in the chamber. Since deposition of these particles on the substrate may damage the small feature sized devices being made on the substrate, which would lower the yield of good devices, the formation of particles in the chamber must be avoided. Further, if there is any native oxide on the shield/clamping ring surfaces, the sputtered material does not adhere well and flaking results after fewer sputtering cycles than when the native oxide has been removed. Once flaking and particle generation has begun, the chamber must be disassembled and the various parts cleaned or replaced.

Thus it is also known to etch clean the shield and clamping ring periodically to remove native oxide and sputtered material. Removal of the native oxide improves the adhesion of sputtered material to the shield, thereby decreasing the likelihood that material will flake off to form particles, or at the least extends the number of sputtering cycles that can be run between cleanings or replacement of these parts. This etch cleaning process is described for example in U.S. Pat. No. 5,202,008 to Talieh et al, incorporated herein by reference. After reassembly of the chamber, parts will have formed a native oxide coating thereon, which also must be removed as explained above.

However, when a collimator is used in a physical vapor deposition (hereinafter PVD) chamber, such as is disclosed in U.S. Pat. No. 5,171,412 to Talieh et al, also incorporated hereby by reference, I have found that finely divided particles coat the bottom of the collimator facing the substrate. These particles can fall onto the surface of the substrate being coated, and thus their formation must be prevented.

Thus a method of in situ, periodic cleaning of a PVD chamber containing a collimator has been sought.

SUMMARY OF THE INVENTION

I have discovered that when a collimator is employed in a PVD chamber, the conventional etch cleaning step is effective only in the area of the chamber above the collimator; the collimator is grounded, and thus the etch cleaning plasma does not pass through the collimator. Therefore the conventional etch cleaning does not remove material from the bottom surface of the collimator, the clamping ring or the shield about the substrate.

Thus in accordance with the invention, a two step cleaning step is carried out. In the first step, a conventional etch cleaning step is performed in the upper part of the chamber to remove native oxide and other material on the upper surface of the collimator and other surfaces; then a positive bias is connected to the substrate support or pedestal, which is electrically isolated from the grounded chamber. At this point a cleaning plasma can form in the region of the chamber below the collimator, between the collimator and the substrate support, whereupon etch cleaning of the bottom of the collimator, the clamping ring and the shield is carried out.

The apparatus of the invention is modified so that a positive bias is connected to the pedestal or wafer support during the second step of etch processing.

DETAILED DESCRIPTION OF THE INVENTION

Figure 1:
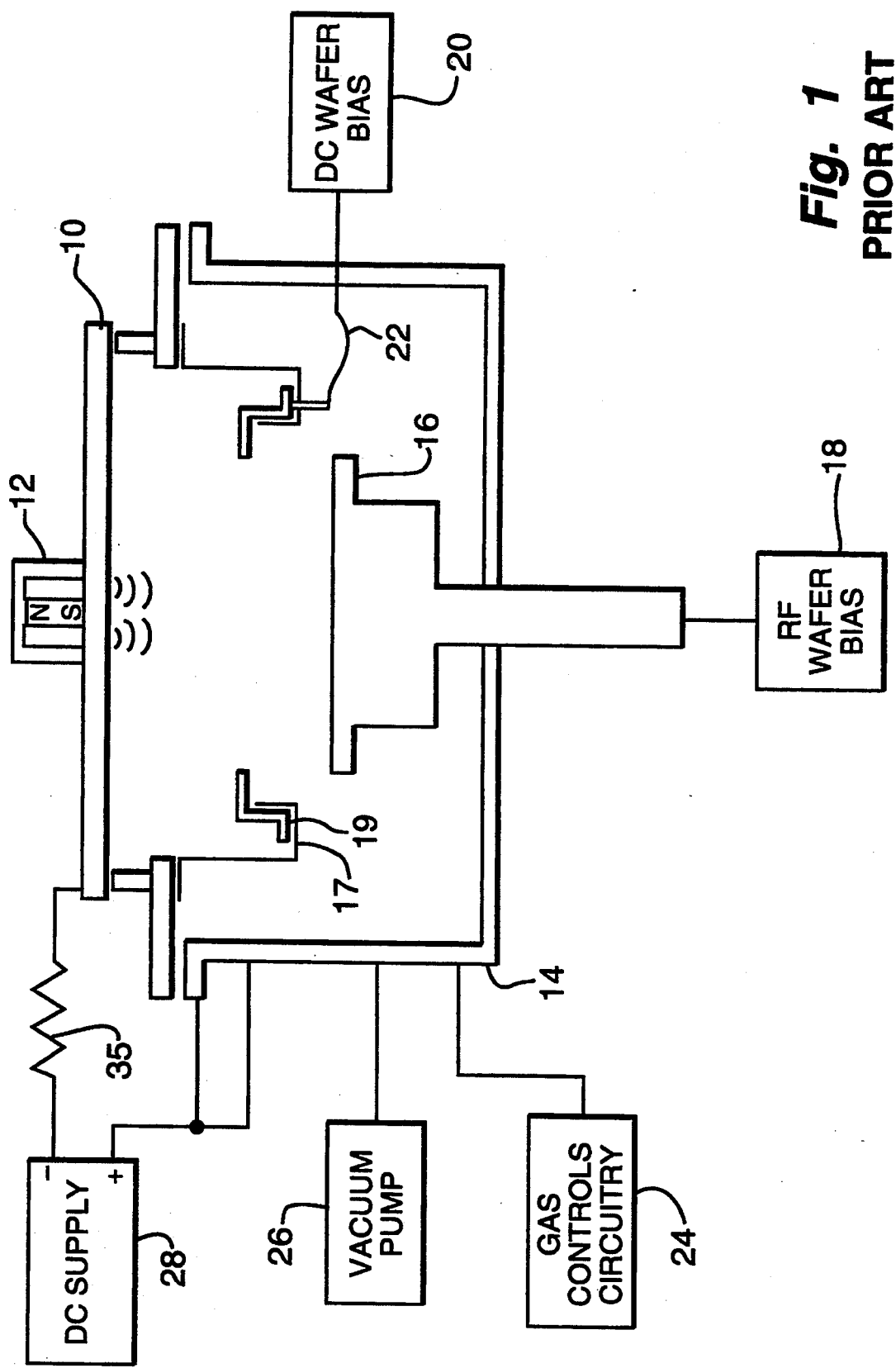
FIG. 1 is a schematic drawing of a prior art PVD chamber arranged for conventional plasma cleaning.

FIG. 1 illustrates a conventional PVD chamber arranged to sputter etch clean a shield and clamping ring in accordance with the prior art. The sputter etch cleaning serves to remove contamination such as native oxide which can form a diffusion barrier and can prevent sputtered material from bonding to the shield, as well as to other parts of the chamber, and to remove material deposited onto these parts during sputtering.

A flat cover plate 10, made of a vacuum compatible material such as aluminum, stainless steel and the like, has mounted thereon an assembly of permanent magnets 12. The magnet assembly 12 covers less than half of the surface of the cover plate 10. The PVD chamber 14 includes a movable substrate support or pedestal 16, upon which a substrate can be mounted during processing. An RF bias circuit 18 connected to the support 16 provides an RF bias voltage to the substrate during processing. A DC bias circuit 20 provides a DC bias to the substrate through a line 22. Other standard parts of conventional PVD chambers include a gas supply and flow controls 24 to control the gas flow into the chamber; and an exhaust vacuum pump 26 which creates a vacuum in the chamber during processing of the substrate. A shield 17 surrounds the substrate during processing and a clamping ring 19 maintains the substrate against the substrate support during processing.

During etch cleaning, the cover plate 10 is biased positively to a value of between +300 to +1000 volts. The cover plate 10 thus becomes the anode of a glow discharge in the chamber 14. The required voltage can be obtained using from about 50–500 Watts of power to the cover plate 10. The negative terminal of the power supply 28 is grounded to the chamber 14, the shield 17 and the clamping ring 19. The pressure in the chamber is maintained at about 1 millitorr (mT) to 20 mT of argon during the cleaning step.

The magnet assembly 12 maintains a plasma at low pressure, when the process is most efficient at etching the grounded shield 17 and the clamping ring 19. A plasma can also be maintained at higher pressures of about 50–200 mT by applying a high AC or DC voltage. At a discharge power of 250 Watts, the parts of the PVD chamber 14 such as the shield 17 and the clamping ring 19 can be cleaned in several minutes using a 1000 volt constant power supply in conjunction with a high power ballast resistor 35.

The above process provides excellent cleaning of a clamping ring and a shield in an in situ process which does not require replacement of parts or lengthy cleaning times. Further, the chamber is not exposed to the atmosphere during cleaning cycles.

Figure 2:
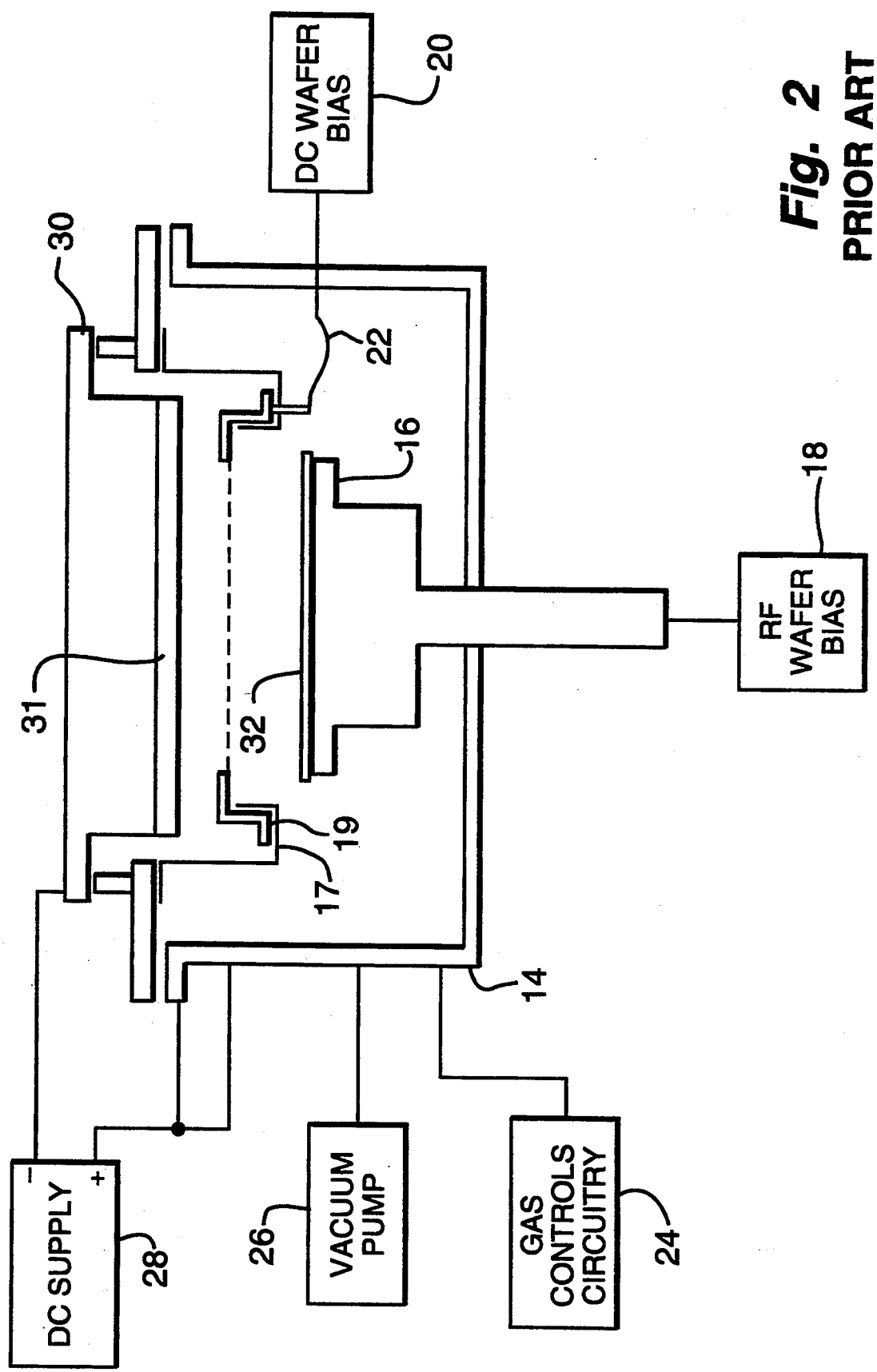
FIG. 2 is a schematic drawing of a prior art PVD chamber arranged for conventional sputtering.

During a normal sputtering cycle, as shown in FIG. 2, a target mount 30 overlies the wafer during processing which is mounted in the PVD chamber 14 in place of the cover plate 10. This target 30 is connected to a DC power supply 28 which establishes a voltage potential between the grounded chamber 14 and the target material source 31 mounted onto the target mount 30. During sputtering, the support 16, having a substrate 32 thereon, is moved upwardly into the processing position, shown in dotted line, so that the substrate 32 is contacted by the clamping ring 19. The negative terminal of the DC supply 28 is connected to the target mount 30 and the positive terminal is grounded to the chamber 14. Thus ions in the plasma generated from the gas supply strike or bombard the material source 31, removing portions of the material, which are accelerated toward the substrate 32, which is negatively biased.

Figure 3:
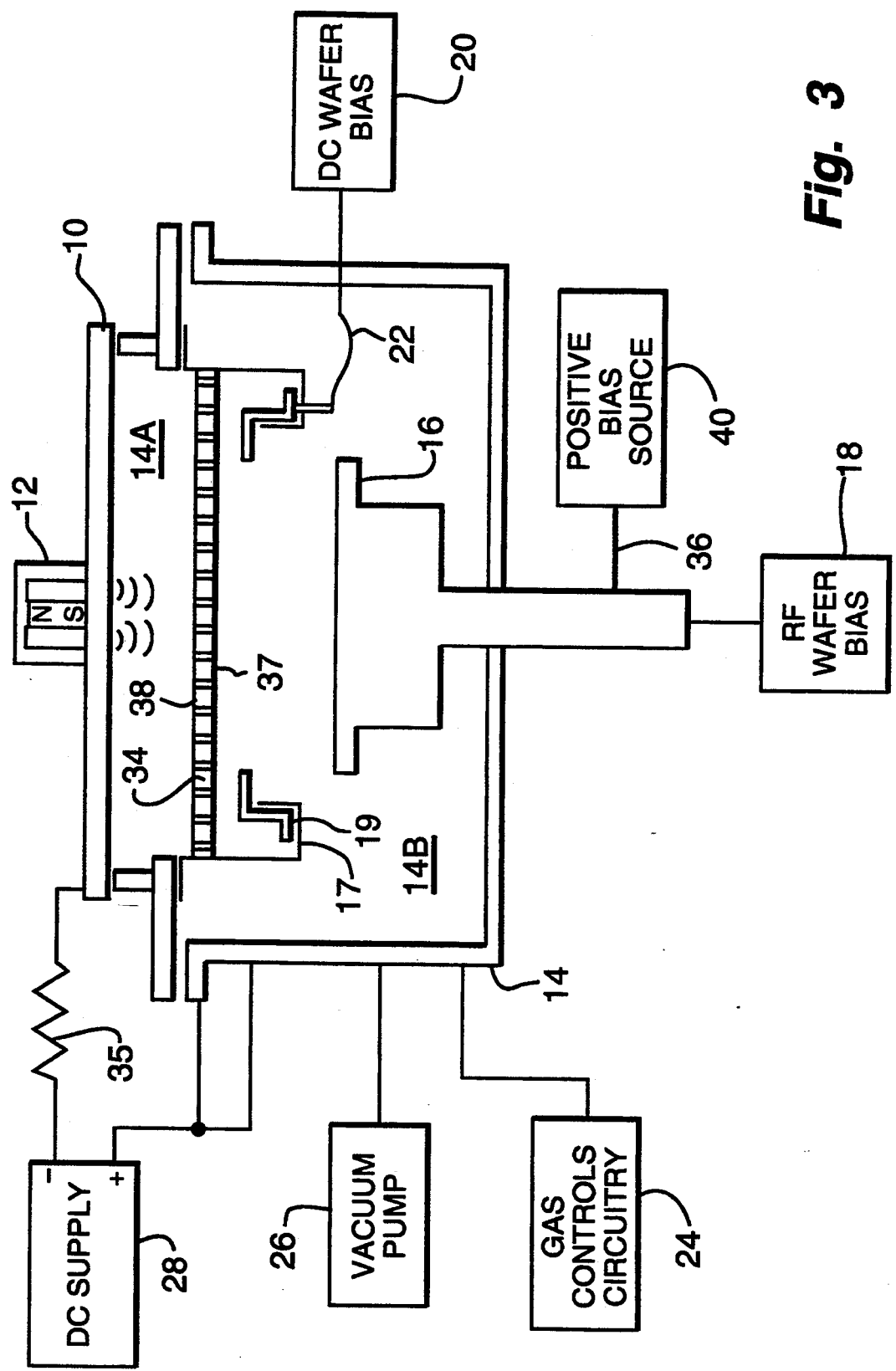
FIG. 3 is a schematic drawing of a PVD chamber of the invention having a collimator arranged for plasma cleaning of the bottom portion of the chamber.

FIG. 3 is a schematic view of a PVD chamber modified in accordance with the invention having a collimator 34 mounted therein between the target mount 30 and the substrate 32. The collimator 34 for the present purposes divides the PVD chamber 14 into an upper portion 14A and a lower portion 14B. All other parts of the PVD chamber are conventional and the same numerals are used as for similar parts in FIGS. 1 and 2.

During normal PVD processing, particles collect on the bottom surface of the collimator 34. These may be caused by backscattering from the material deposited onto the substrate for example. When a collimator 34 is employed during plasma cleaning of the prior art chamber of FIG. 1, since the collimator is grounded to the chamber 14, the collimator 34 becomes a plasma barrier in both directions; thus in a first cleaning step the plasma is confined to the upper part of the chamber 14A above the collimator 34. The top surface 38 of the collimator 34 can be cleaned in conventional fashion, but no plasma forms in the bottom part of the chamber 14 below the collimator 34. Thus no cleaning of the bottom surface 37 of the collimator 34 nor of the shield 17 or clamping ring 19 occurs during the first process step.

Thus in a second cleaning step, a positive bias from a source 40 is applied via a line 36 to an electrically isolated part of the chamber 14 in the bottom portion of the chamber, conveniently the substrate support 16. This positive bias creates a plasma in the lower chamber, 14B, i.e., in the area between the collimator 34 and the support 16, whereby the ions in the plasma clean and bombard the surfaces in the lower chamber 14B including the bottom surface 37 of the collimator 34, the clamping ring 19 and the shield 17. This two step plasma cleaning process removes native oxide and sputtered material from all surfaces of the chamber exposed to plasma cleaning.

Various gases may be supplied to the PVD chamber 14 during etch cleaning, such as hydrogen, oxygen, fluorine-containing gases or inert gases such as argon, depending on the materials to be removed. However, oxygen-containing gases will leave a thin native oxide film on parts in the chamber.

For plasma cleaning, the chamber pressure is generally maintained at from about 1 mT to 20 mT. The power supplied can be from about 50 to 500 Watts.

Various alternative embodiments will be known or will be apparent to one skilled in the art and are meant to be included herein. The invention is only meant to be limited by the appended claims.

I claim:

1. A method of in situ plasma cleaning of a physical vapor deposition chamber comprising a target connected to a DC power supply, a substrate support mounted opposite said target and connected to an RF power supply, and a collimator mounted between said target and said support, thereby forming an upper portion of the chamber between the collimator and the target and a lower portion of the chamber between the collimator and said support, comprising
    a) replacing said target with a cover plate connected to said DC power supply,
    b) supplying a plasma precursor gas to said chamber and applying power to said cover plate so as to create a first plasma to clean the upper portion of the chamber between the target and the collimator,
    c) connecting said substrate support to a positive terminal of a DC power supply, and
    d) creating a second plasma to clean the lower portion of the chamber between the collimator and the substrate support, thereby removing deposits from both sides of said collimator.

2. A method according to claim 1 wherein a magnet assembly is connected to said cover plate.

3. A method according to claim 1 wherein said precursor gas is argon.

4. A method according to claim 1 wherein, after step d), the cover plate is replaced with the target.

* * * * *